US00RE48942E

(19) United States
(12) Reissued Patent
Kelly et al.

(10) Patent Number: US RE48,942 E
(45) Date of Reissued Patent: Feb. 22, 2022

(54) FINFET DEVICE WITH EPITAXIAL STRUCTURE

(71) Applicant: TAIWAN SEMICONDUCTOR MANUFACTURING COMPANY, LTD., Hsin-Chu (TW)

(72) Inventors: Andrew Joseph Kelly, Hsinchu County (TW); Po-Ruwe Tzng, Kaohsiung (TW); Pei-Shan Chien, Keelung (TW); Wei-Hsiung Tseng, New Taipei (TW)

(73) Assignee: TAIWAN SEMICONDUCTOR MANUFACTURING COMPANY, LTD., Hsinchu (TW)

(21) Appl. No.: 15/639,627

(22) Filed: Jun. 30, 2017

Related U.S. Patent Documents

Reissue of:
(64) Patent No.: 9,166,010
Issued: Oct. 20, 2015
Appl. No.: 14/708,985
Filed: May 11, 2015

U.S. Applications:
(63) Continuation of application No. 14/222,010, filed on Mar. 21, 2014, now Pat. No. 9,029,930, which is a (Continued)

(51) Int. Cl.

| | |
|---|---|
| ***H01L 29/417*** | (2006.01) |
| ***H01L 29/66*** | (2006.01) |
| ***H01L 29/06*** | (2006.01) |
| ***H01L 21/3065*** | (2006.01) |
| ***H01L 29/78*** | (2006.01) |
| ***H01L 27/092*** | (2006.01) |

(Continued)

(52) U.S. Cl.
CPC .... *H01L 29/66795* (2013.01); *H01L 21/3065* (2013.01); *H01L 21/76224* (2013.01); *H01L 21/823814* (2013.01); *H01L 21/823821* (2013.01); *H01L 21/823864* (2013.01); *H01L 21/823878* (2013.01); *H01L 27/0924* (2013.01); *H01L 29/0653* (2013.01); *H01L 29/41766* (2013.01); *H01L 29/41791* (2013.01); *H01L 29/6656* (2013.01); *H01L 29/785* (2013.01); *H01L 29/7851* (2013.01)

(58) Field of Classification Search
CPC ..... H01L 29/41766; H01L 29/0653; H01L 21/823878; H01L 21/823864; H01L 21/823821; H01L 21/823814; H01L 27/0924; H01L 21/3065; H01L 29/66795; H01L 29/7851; H01L 29/6656; H01L 29/41791; H01L 21/76224
See application file for complete search history.

(56) References Cited

U.S. PATENT DOCUMENTS 7,074,662 B2 * 7/2006 Lee et al. ..... 438/199
7,939,889 B2 * 5/2011 Yu ..... H01L 29/66795 257/347

(Continued)

*Primary Examiner* — Leonardo Andujar
(74) *Attorney, Agent, or Firm* — Haynes and Boone, LLP

(57) ABSTRACT

A FinFET device includes a substrate, a fin, and isolation regions on either side of the fin. The device also includes sidewall spacers above the isolation regions and formed along the fin structure. A recessing trench is formed by the sidewall spacers and the fin, and an epitaxially-grown semiconductor material is formed in and above the recessing trench, forming an epitaxial structure.

31 Claims, 13 Drawing Sheets

Related U.S. Application Data continuation of application No. 13/599,393, filed on Aug. 30, 2012, now Pat. No. 8,703,556.

(51) Int. Cl.
*H01L 21/8238* (2006.01)
*H01L 21/762* (2006.01)

(56) References Cited

U.S. PATENT DOCUMENTS

| | | | | |
|---|---|---|---|---|
| 8,263,451 | B2 | 9/2012 | Su et al. | |
| 2008/0265321 | A1* | 10/2008 | Yu | H01L 21/26586 257/344 |
| 2011/0073952 | A1* | 3/2011 | Kwok | H01L 29/045 257/368 |
| 2012/0138886 | A1* | 6/2012 | Kuhn et al. | B82Y 10/00 257/9 |
| 2013/0187206 | A1* | 7/2013 | Mor et al. | 257/288 |
| 2013/0187228 | A1 | 7/2013 | Xie et al. | H01L 29/785 257/347 |
| 2013/0249019 | A1 | 9/2013 | Kelly et al. | |
| 2013/0285129 | A1 | 10/2013 | Jensen et al. | |
| 2013/0286129 | A1 | 10/2013 | Jensen et al. | |
| 2014/0203338 | A1 | 7/2014 | Kelly et al. | |

* cited by examiner

FINFET DEVICE WITH EPITAXIAL STRUCTURE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

PRIORITY CLAIM AND CROSS-REFERENCE

The present application is a continuation application of U.S. application Ser. No. 14/222,010, filed Mar. 21, 2014, which is a continuation of U.S. application Ser. No. 13/599,393 filed Aug. 30, 2012, issued as U.S. Pat. No. 8,703,556, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a variation of height and width of source/drain epitaxial structures raise challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
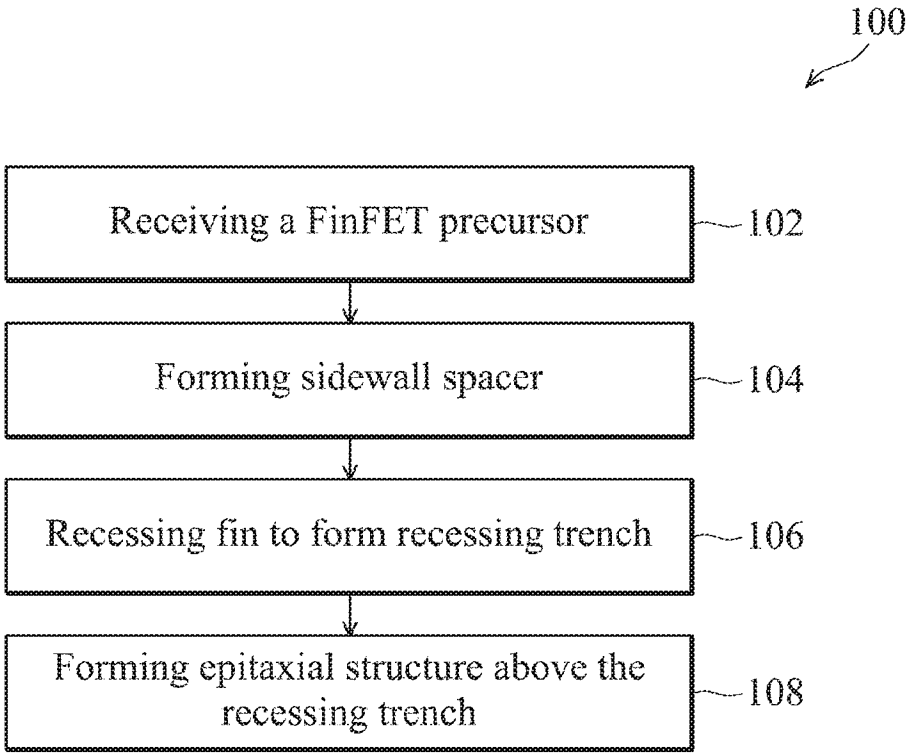
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present application are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

Figure 2:
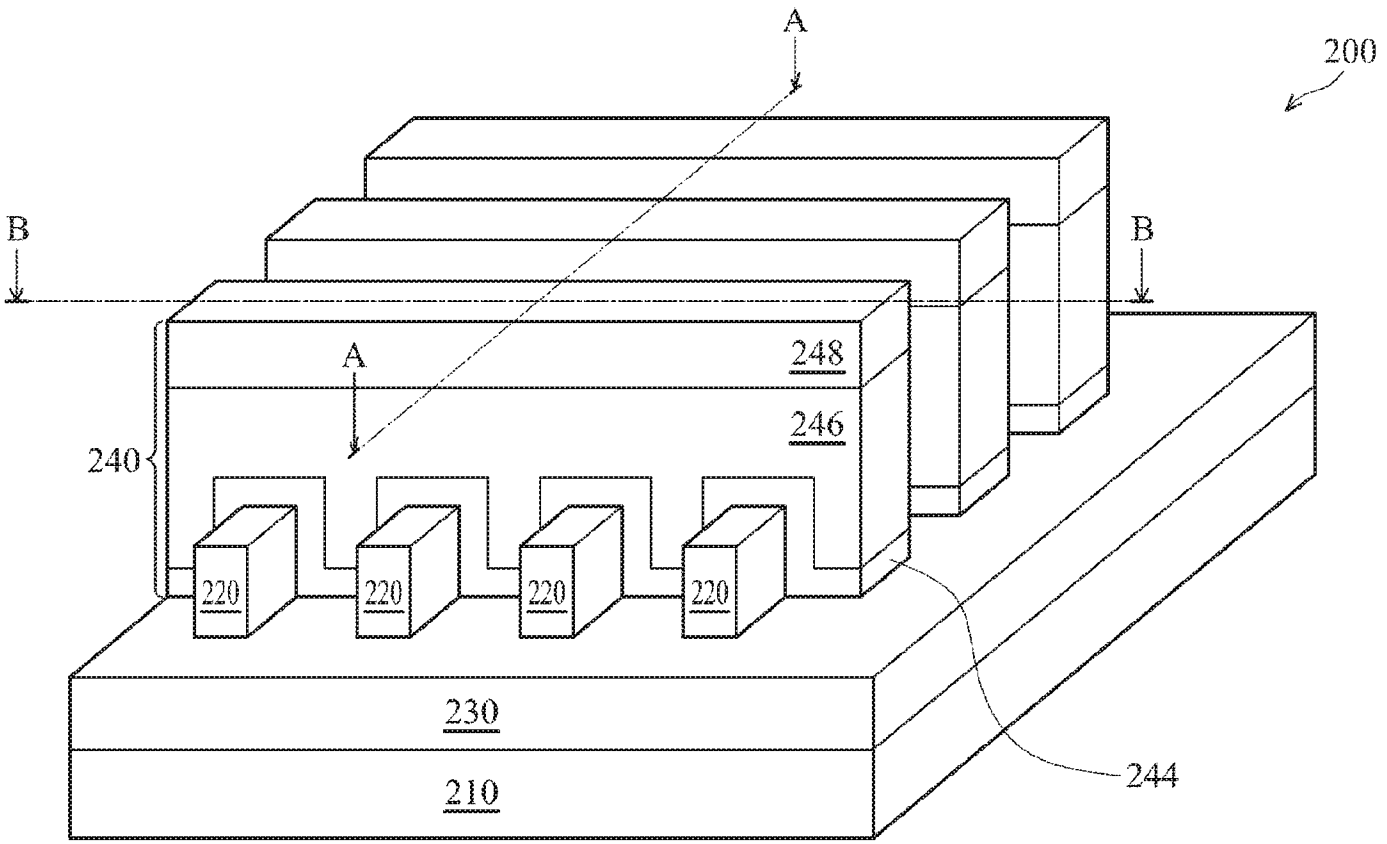
FIG. 2 is a top view of a FinFET precursor according to various aspects of the present disclosure.
Figure 3A:
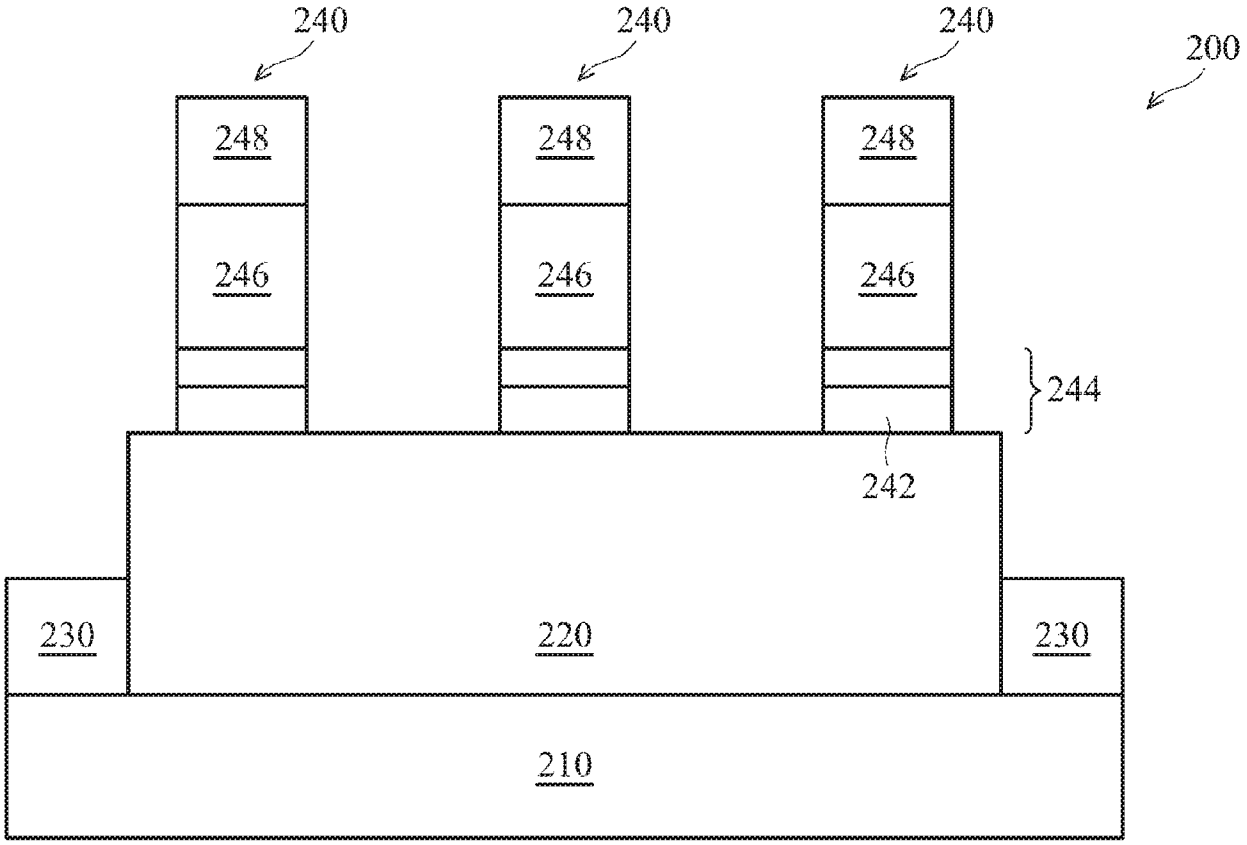
FIG. 3A illustrates a cross sectional view of a FinFET precursor along line A-A in FIG. 2.
Figure 3B:
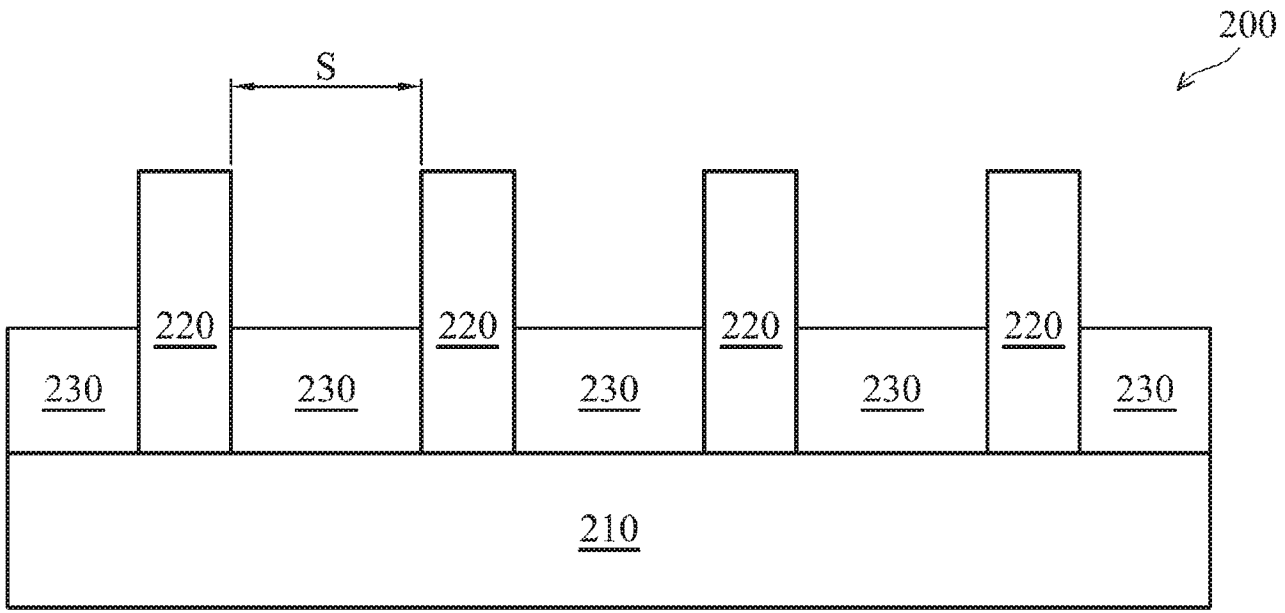
FIG. 3B illustrates cross sectional view of a FinFET precursor along line B-B in FIG. 2.

FIG. 1 is a flowchart of a method for fabricating a FinFET device 600 according to aspects of the present disclosure. FIG. 2 is a top-side view of a FinFET precursor 200. Referring to FIG. 2, cross section views of the FinFET precursor 200 and FinFET device 600 are taken along lines of A-A and B-B. FIGS. 3A, 4A, 5A and 6A are cross section views along the line A-A of FIG. 2. FIGS. 3B, 4B, 5B, 6B, 7A, 7B and 7C are cross section views along the line B-B of FIG. 2 and perpendicular to the direction of the line of A-A. The method 100, the FinFET precursor 200 and the FinFET device 600 are collectively described with reference to FIG. 1 through FIG. 7. It is understood that additional steps can be provided before, during, and after the method 100, and some of the steps described can be replaced or eliminated for other embodiments of the method.

The method 100 begins at step 102 by receiving a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide semiconductor transistor device.

A fin 220 is formed on the substrate 210. In some embodiments, the precursor 200 comprises more than one fin 220 with a spacing distance (S) to each other. The fin 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. Areas not protected by the masking element are etched using reactive ion etching (RIE) processes and/or other suitable processes. In an example, the silicon fin 220 is formed by patterning and etching a portion of the silicon substrate 210. In another example, the fin 220 is formed by patterning and etching a silicon layer deposited overlying an insulator layer (for example, an upper silicon layer of a silicon-insulator-silicon stack of an SOI substrate). As an alternative to traditional photolithography, the fin 220 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 220 may be formed in a similar manner.

The substrate 210 may include isolation regions 230 to isolate active regions of the substrate 210, and may be further used to separate the fins 220. The isolation region 230 may be formed using traditional isolation technology, such as shallow trench isolation (STI), to define and electrically isolate the various regions. The isolation region 230 comprises silicon oxide, silicon nitride, silicon oxynitride, an air gap, other suitable materials, or combinations thereof. The isolation region 230 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

One or more gate stacks 240 are formed over the substrate 210, including over (wrapping) a portion of the fin 220. The gate stack 240 may include a dielectric layer 244, a gate electrode layer 246 and a hard mask layer 248. It is understood that the gate stack may include additional layers such as interfacial layers, capping layers, diffusion/barrier layers, dielectric layers, conductive layers, other suitable layers, and/or combinations thereof. For example, the dielectric 244 may include an interfacial layer (IL) 242 and a gate dielectric layer 243. The IL is formed over the substrate 210 and fins 220. The IL 242 is formed by any suitable process to any suitable thickness. An exemplary IL includes silicon oxide (e.g., thermal oxide or chemical oxide) and/or silicon oxynitride (SiON). The gate dielectric layer 243 is formed over the IL 242 by any suitable process. The gate dielectric layer 243 comprises a dielectric material, such as silicon oxide, silicon nitride, silicon oxynitride, high-k dielectric material, other suitable dielectric material, and/or combinations thereof. Examples of high-k dielectric material includes HfO2, HfSiO, HiSiON, HfTaO, HfTiO, HfZrO, zirconium oxide, aluminum oxide, hafnium dioxide-alumina (HfO2-Al2O3) alloy, other suitable high-k dielectric materials, and/or combinations thereof.

The gate electrode layer 246 is formed over the dielectric layer 244 by any suitable process. The gate electrode layer 246 includes any suitable material, such as polysilicon, aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 248 is formed over the gate electrode layer 246 by any suitable process. The hard mask layer 248 includes any suitable material, for example, silicon nitride, SiON, SiC, SiOC, spin-on glass (SOG), a low-k film, tetra-ethylorthosilicate (TEOS), plasma enhanced CVD oxide (PE-oxide), high-aspect-ratio-process (HARP) formed oxide, and/or other suitable material.

The gate stack 240 is formed by any suitable process or processes. For example, the gate stack 240 can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

In another embodiment, the gate stack 240 is a dummy gate stack and is replaced later by a metal gate (MG) after high thermal budget processes are performed. The dummy gate stack 240 may include the dielectric layer 244, the polysilicon layer 246 and the hard mask 248.

Figure 4A:
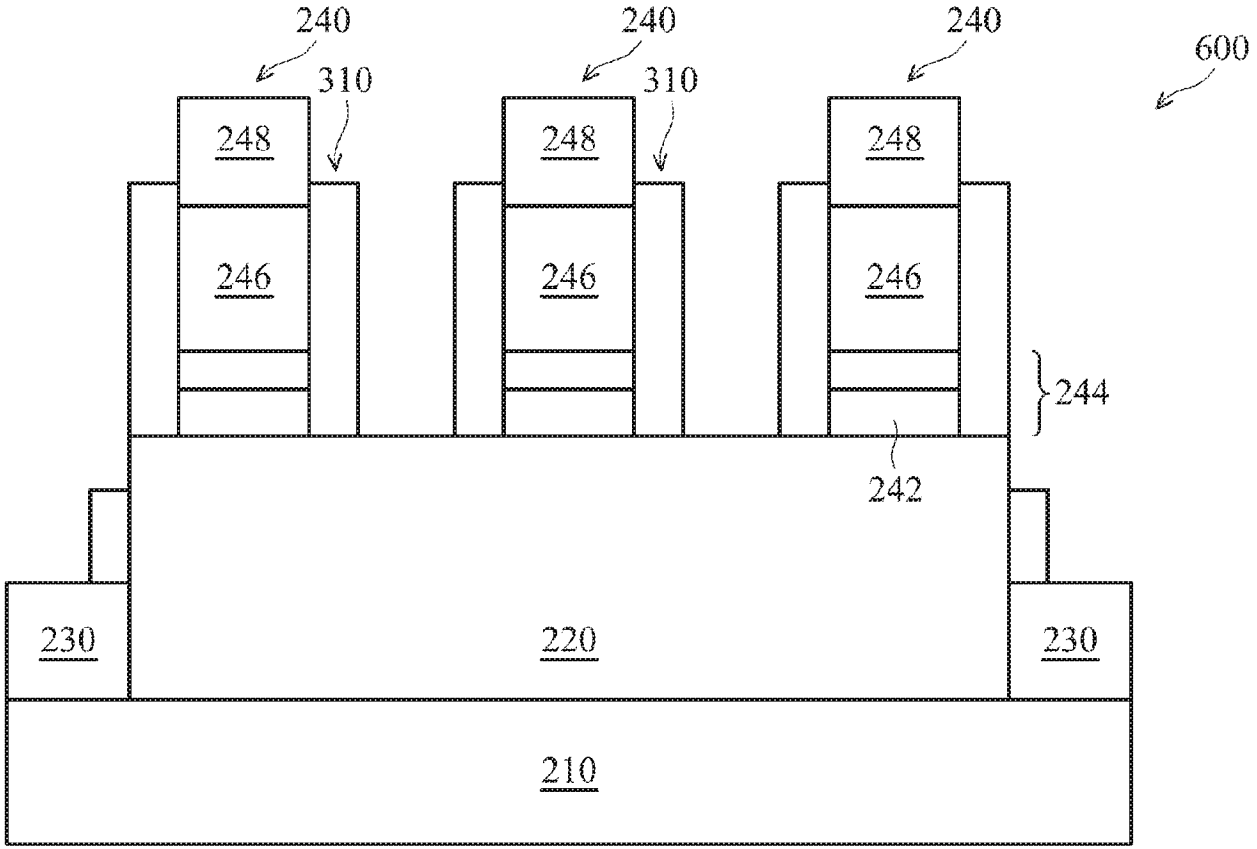
FIGS. 4A, 5A, 6A illustrate cross sectional views of a FinFET device along line A-A in FIG. 2.
Figure 4B:
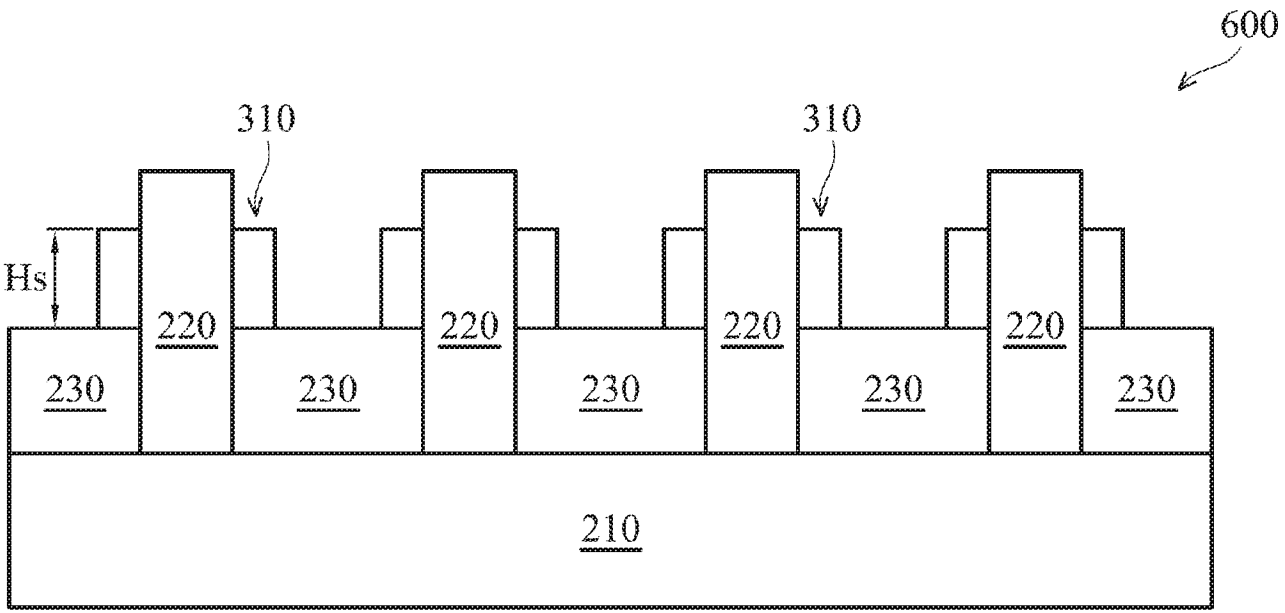
FIGS. 4B, 5B, 6B, 7A, 7B and 7C illustrate cross sectional views of a FinFET device along line B-B in FIG. 2.

Referring again to FIG. 1, once the FinFET precursor 200 is received, the method 100 proceeds to step 104 by forming a sidewall spacer 310 along the gate stack 240 and the fin 220, as shown in FIGS. 4A and 4B. The sidewall spacers 310 generally include a dielectric material such as silicon oxide. Alternatively, the sidewall spacers 310 may include silicon nitride, SiC, SiON, or combinations thereof. Typical formation methods for the sidewall spacers 310 include depositing a dielectric material over the gate stack 240 and the fin 220, and then anisotropically etching back the dielectric material. The etching back process may include a multiple-step etching to gain etch selectivity, flexibility and desired overetch control. In the present embodiment, a depth of etching back is controlled to achieve a predetermined fin-spacer-height (Hs). Here the Hs is defined as the spacer height along the fin 220. The Hs is adjustable by adjusting the etching back process, such as etching parameters of overetch. The Hs is designed to achieve target dimensions of a subsequent epitaxial structure, which will be described in details later.

Figure 5A:
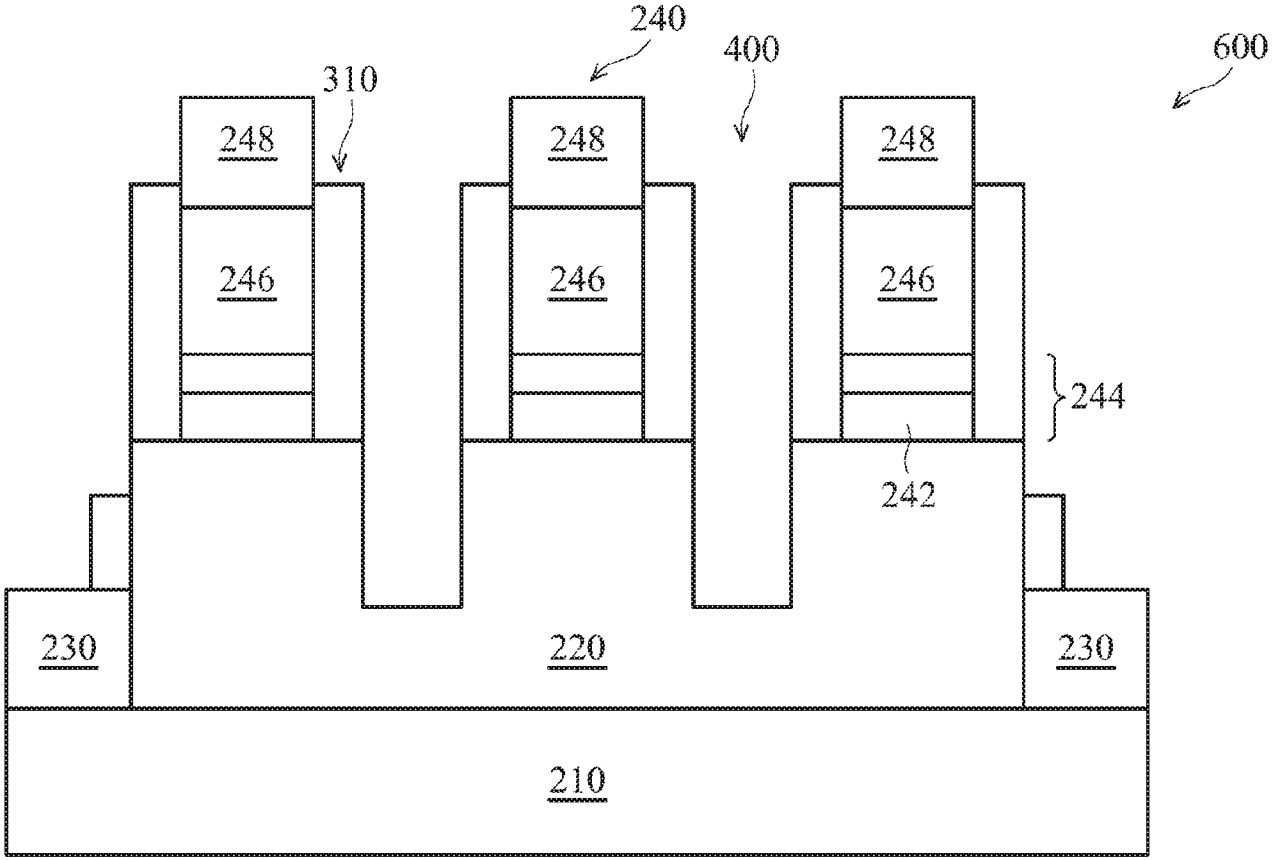
Figure 5B:
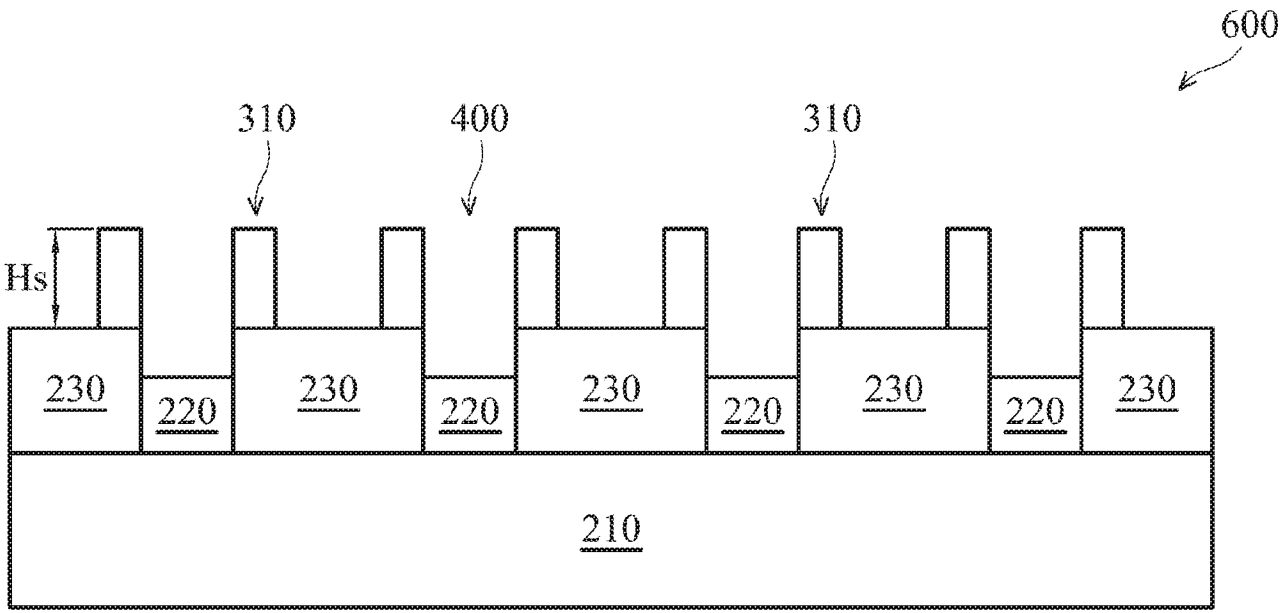

The method 100 proceeds to step 106 by recessing fins 220 to form a recessing trench 400, as shown in FIGS. 5A and 5B. In the depicted embodiment, the recessing trench 400 is formed with the sidewall spacer as its upper portion. In one embodiment, sidewalls of the recess trench 400 are substantially and vertical parallel to each other. In another embodiment, the recessing trench 400 is formed with a non-vertical parallel profile.

The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF4, NF3, SF6, and He. Dry etching may also be performed anisotropically using such mechanisms as DRIE (deep reactive-ion etching).

Figure 6A:
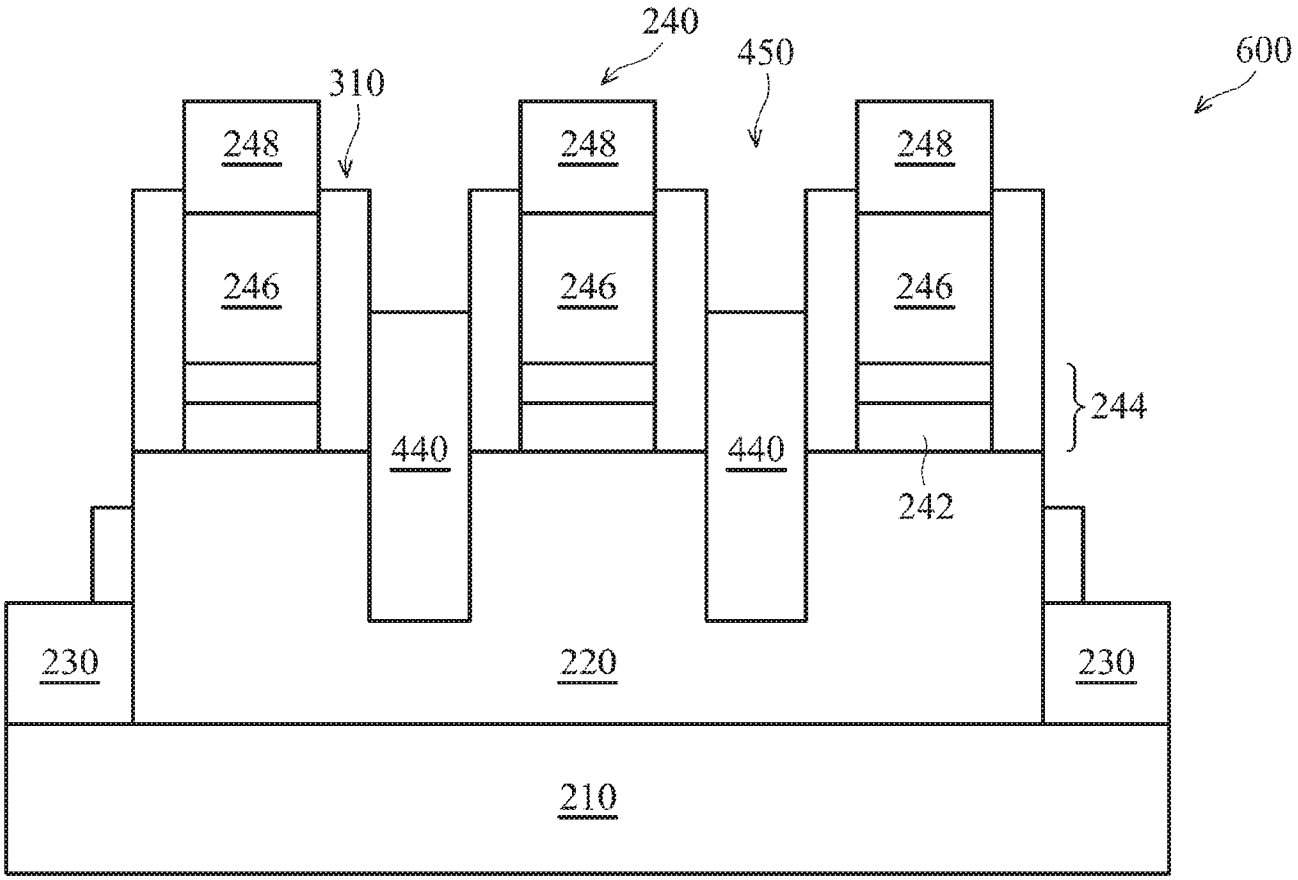
Figure 6B:
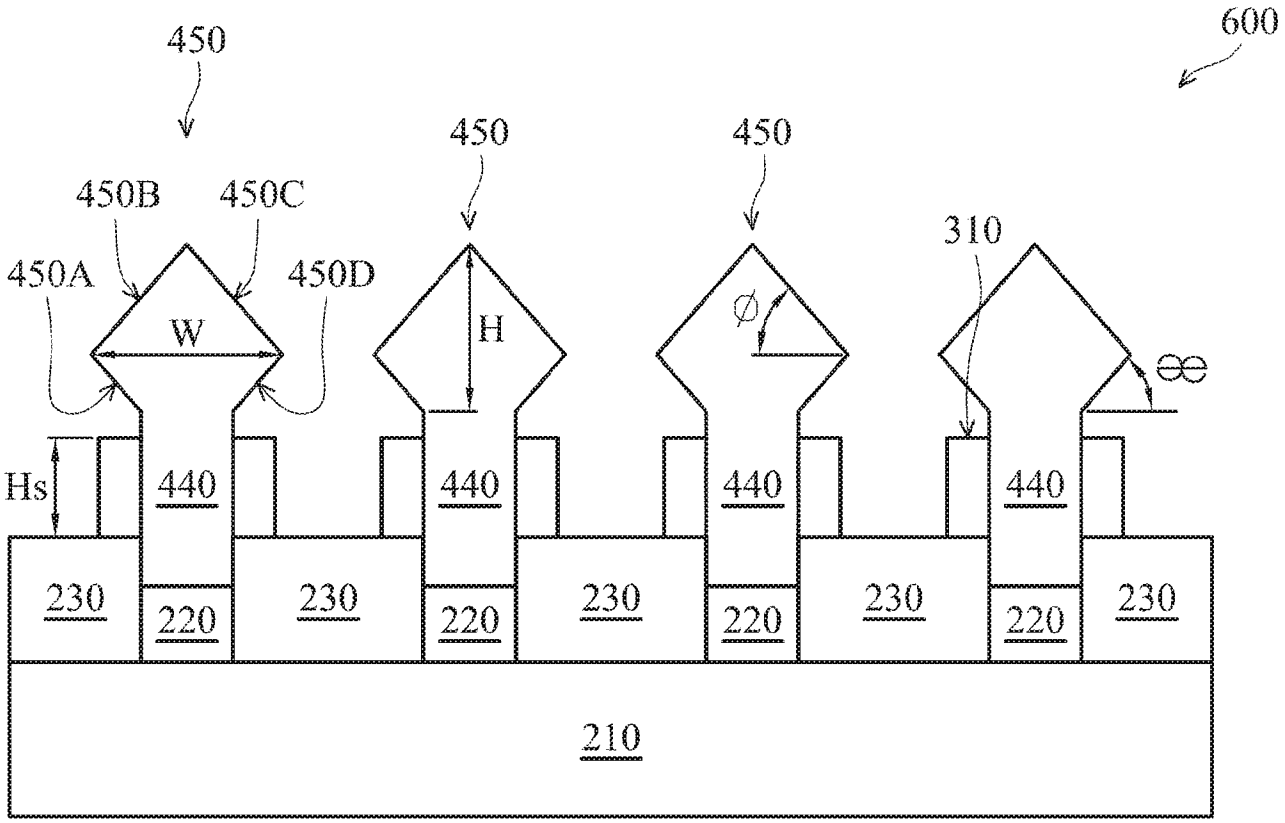

The method 100 proceeds to step 108 by forming epitaxial structures 450 above the recessing trench 400, as shown in FIGS. 6A and 6B. The epitaxial structures 450 are formed by epitaxially growing a semiconductor material 440. The semiconductor material 440 includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial structures 450 has any suitable crystallographic orientation (e.g., a (100), (110), or (111) crystallographic orientation). In on embodiment, the epitaxial structure 450 includes source/drain epitaxial structure. In an example, where an N-type FET (NFET) device is desired, the source/drain epitaxial structures 450 may include an epitaxially growing silicon (epi Si) 440. Alternatively, where a P-type FET (PFET) device is desired, epitaxial source/drain structures 450 may include an epitaxially growing silicon germanium (SiGe) 440. As shown in the figures, the epitaxial structure 450 can include a diamond shape, due to the crystalline structure.

The semiconductor material 440 epitaxially grows on the recessed fins 220 in the recessing trench 400 and continually growing to above the recessing trench to form the epitaxial structure 450 with a height (H) and a width (W).

The epitaxial structures 450 may be formed by one or more epitaxy or epitaxial (epi) processes, such that one or more epitaxial features, such as Si features, SiGe features, and/or other suitable features can be formed in a crystalline state on the recessed fin 220. The epitaxial processes include CVD deposition techniques (e.g., vapor-phase epitaxy (VPE) and/or ultra-high vacuum CVD (UHV-CVD)), molecular beam epitaxy, and/or other suitable processes.

In one embodiment, the epitaxial structure 450 has four facets, 450A, 450B, 450C and 450D. Each facet has a (111) crystallographic orientation. The shape of the epitaxial structure 450 is similar to a rhombus shape, meaning that the facet 450A is parallel to the facet 450C and the facet 450B is parallel to the facet 450D. Facets 450A and 450D have a fixed angle (æ) with the surface of the isolation feature 220. Facets 450B and 450D have a fixed angle (ϕ) with a direction, which parallels with the surface of the isolation feature 220. As an example, the (angle ϕ) is 54.7 degree as well as the (angle æ).

Figure 7A:
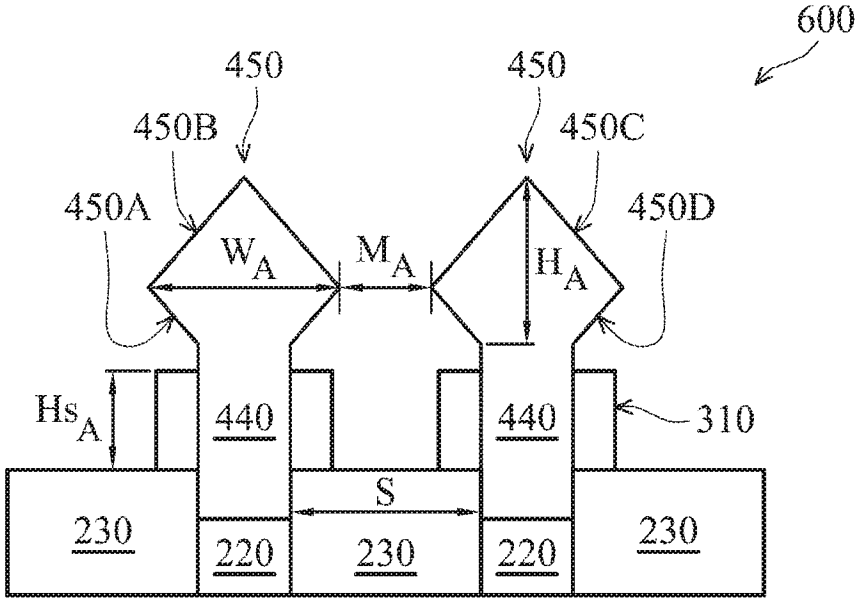
Figure 7B:
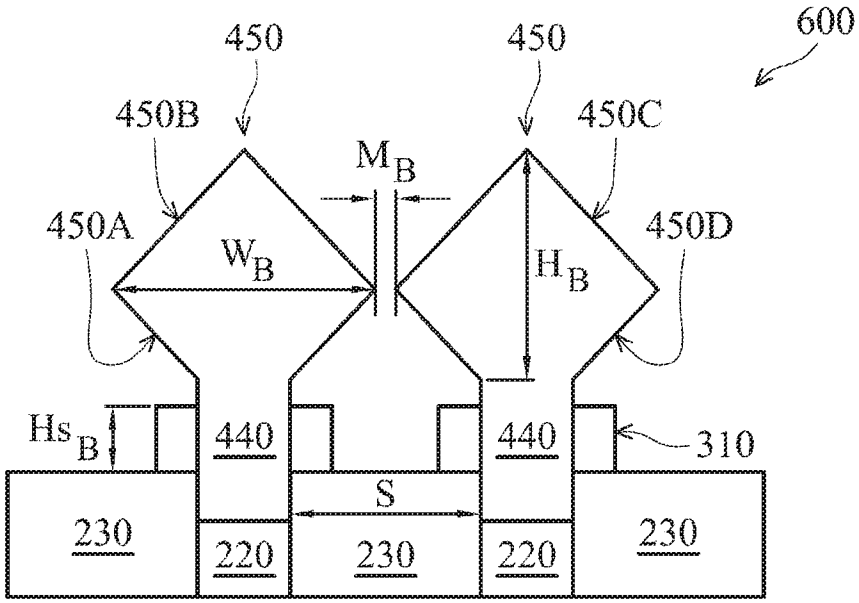
Figure 7C:
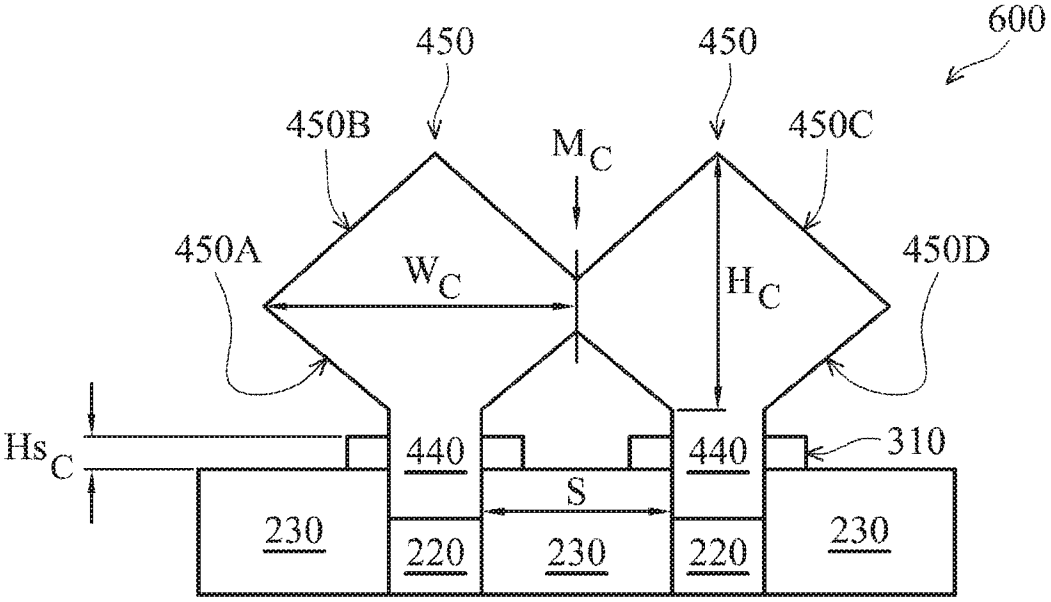

Referring to FIGS. 7A-7C, with a fixed spacing distance (S) between two adjacent fins 220, different fin-spacer-heights (Hs) may result in different H and W of the epitaxial structure 450 and also a different merging distance (M) between two adjacent epitaxial structure 450. Here, the M is defined as the distance between two nearest vertexes of two adjacent epitaxial structures 450. When two adjacent vertexes merge together, the M has a value from zero to a negative value. In one embodiment, where HsA is larger than HsB and HsB is larger than HsC:

MA>MB>MC (which is a negative value),

WC>WB>WA, and

HC>HB>HA.

The epitaxial structures 450 may be in-situ doped or undoped during the epi process. For example, the epitaxially grown SiGe source/drain features 450 may be doped with boron; and the epitaxially grown Si epi source/drain features may be doped with carbon to form Si:C source/drain features, phosphorous to form Si:P source/drain features, or both carbon and phosphorous to form SiCP source/drain features. If the epitaxial structures 450 are not in-situ doped, a second implantation process (i.e., a junction implant process) is performed to dope the epitaxial structure 450. One or more annealing processes may be performed to activate source/drain epitaxial feature. The annealing processes comprise rapid thermal annealing (RTA) and/or laser annealing processes.

In one embodiment, the method 100 may further include removing the sidewall spacer 310 after the formation of the epitaxial structure 450. The sidewall spacer 310 may be removed by a selective etching process.

Additional steps can be provided before, during, and after the method 100, and some of the steps described can be replaced, eliminated, or moved around for additional embodiments of the method 100. For example, when forming the epitaxial structure 450 in a PMOS device, one or more layers, such as photoresist and dielectric layers are formed on the NMOS device as protection layers by deposition processes.

The FinFET device 600 may include additional features, which may be formed by subsequent processing. For example, various contacts/vias/lines and multilayer interconnect features (e.g., metal layers and interlayer dielectrics) may be formed over the substrate, configured to connect the various features or structures of the devices 600. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure offers methods for fabricating a FinFET device.

The method employs tuning the height (H), width (W) and merging distance (M) of epitaxial structure by adjusting the fin-spacer-height (Hs). The method demonstrates to achieve a better control of the H, W and M of the epitaxial structure and improvement of FinFET device performance.

The present disclosure provides many different embodiments of a FinFET device that provide one or more improvements over the prior art. In one embodiment, a FinFET includes a substrate and fin structures spaced from each other on the substrate, and having a width (W1). The FinFET also includes sidewall spacers along sidewalls of the fin structures and extending to a height (H1) and trenches formed by the fin structures and the sidewall spacers. Epitaxial structures are formed above the trenches, each including a portion with a height (H2) and a width (W2). H2 is greater than H1 and W2 is greater than W1.

In another embodiment, a FinFET device includes a substrate, a fin, and isolation regions on either side of the fin. The device also includes sidewall spacers above the isolation regions and formed along the fin structure. A recessing trench is formed by the sidewall spacers and the fin, and an epitaxially-grown semiconductor material is formed in and above the recessing trench, forming an epitaxial structure.

In another embodiment, a FinFET device includes a FinFET precursor that includes: a substrate; a fin structure on the substrate, the fin structure including fins spaced from each other a spacing distance (S); isolation regions separating the fins; and a gate stack on the substrate. The device also includes sidewall spacers formed with a predetermined spacer height (Hs) along the fins and the gate stack and recessing trenches formed by the fins and the sidewall spacers. Epitaxial source/drain structures are formed above the recessing trenches, wherein a width and a height of the epitaxial source/drain structures are tunable by Hs. Also, a merging spacing between two adjacent epitaxial source/drain structures is tunable by Hs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first fin *and a second fin separated by a distance S* on a semiconductor substrate*, wherein the first fin is directly adjacent to the second fin*;

*forming a gate structure over a first portion of the first fin and a first portion of the second fin;* forming a dielectric isolation feature on the semiconductor substrate[, the dielectric isolation feature having a first height];

[forming a] *performing a process that forms* first sidewall [spacer] *spacers over the dielectric isolation feature* along [a sidewall] *sidewalls* of the first fin *and second sidewall spacers over the dielectric isolation feature along sidewalls of the second fin*, the first sidewall [spacer] *spacers and the second sidewall spacers each* having a [second] *first* height *defined between a top surface of the dielectric isolation feature and top surfaces respectively of the first sidewall spacers and the second sidewall spacers*;

[removing] *recessing* a *second* portion of the first fin *and a second portion of the second fin,* such that a remaining *second* portion of the first fin[has a third height, wherein], the first sidewall [spacer] *spacers,* and the [first fin] *dielectric isolation feature* define a *first* trench *and a remaining second portion of the second fin, the second sidewall spacers, and the dielectric isolation feature define a second trench*;

[forming a first source/drain feature] *epitaxially growing a material* in the *first* trench over the remaining *second* portion of the first fin *to form a first source/drain feature and in the second trench over the remaining second portion of the second fin to form a second source/drain feature*, wherein *each of* the first source/drain feature *and the second source/drain feature* has a [fourth] *top portion over a bottom portion, the top portion having a greater width than the bottom portion, and each of the top portion of the first source/drain feature and the second source/drain feature has a second* height[,]*;* and wherein the [fourth height is greater than the second height and the first height is greater than the third height] *second height is inversely proportional to the first height and the first height is adjusted during the process that forms the first sidewall spacers and the second sidewall spacers to tune the second height*.

2. The method of claim 1, wherein [forming the first source/drain feature in the trench over the remaining portion of the first fin includes forming the first source/drain feature directly on the remaining portion of the first fin such that the first source/drain feature physically contacts the remaining portion of the first fin] *a merging distance is defined between a vertex of the first source/drain feature and a vertex of the second source/drain feature, the merging distance is proportional to the first height, and the first height is adjusted during the process that forms the first sidewall spacers and the second sidewall spacers to tune the merging distance*.

3. The method of claim 1, wherein [forming] the first source/drain feature [in the trench over the remaining portion of the first fin includes forming an epitaxial material on the remaining portion of the first fin] *and the second source/drain feature each has a width defined as a greatest distance between two vertexes respectively of the first source/drain feature and the second source/drain feature, the width is inversely proportional to the first height, and the first height is adjusted during the process that forms the first sidewall spacers and the second sidewall spacers to tune the width*.

4. The method of claim 1, [further comprising] *wherein forming the gate structure over the portion of the first fin and the second fin comprises*: forming a gate dielectric layer over the *portion of the* first fin[;] and *the portion of the second fin; and* forming a gate electrode over the gate dielectric layer.

5. The method of claim 1, wherein the [gate dielectric layer includes a high-k dielectric material and wherein the gate electrode includes a metal material] *performing the process that forms the first sidewall spacers over the dielectric isolation feature along the sidewalls of the first fin and the second sidewall spacers over the dielectric isolation feature along the sidewalls of the second fin includes:*

*depositing a dielectric material over the gate structure, the first fin, and the second fin; and*

*etching back the dielectric material, wherein the etching back is controlled so the first height is a pre-determined*

*spacer height, wherein the pre-determined spacer height achieves target dimensions for the first source/drain feature and the second source/drain feature.*

6. The method of claim [1] *5*, wherein the [remaining portion of first fin has a first width and wherein the first source/drain feature has a second width that is greater than the first width] *etching back is controlled by adjusting etching parameters of over etch.*

7. The method of claim [1] *5*, wherein the [remaining portion of the first fin has a first width and wherein the first source/drain feature has a first portion having the first width and a second portion having a second width that is greater than the first width] *etching back includes anisotropically etching the dielectric material.*

8. The method of claim 1, wherein, [forming the first fin on the semiconductor substrate includes forming a second fin adjacent the first fin on the semiconductor substrate, wherein removing the portion of the first fin includes removing a portion of the second fin such that a remaining portion of the second fin has the third height, and wherein forming the first source/drain feature in the trench over the remaining portion of the first fin includes forming a second source/drain feature on the remaining portion of the second fin] *the performing the process that forms the first sidewall spacers over the dielectric isolation feature along the sidewalls of the first fin and the second sidewall spacers over the dielectric isolation feature along the sidewalls of the second fin further forms gate spacers along sidewalls of a gate stack of the gate structure.*

9. The method of claim [8] *1*, wherein the first [and second source/drain features do not physically contact one another] *source/drain feature physically contacts the second source/drain feature, wherein the first height is adjusted during the process that forms the first sidewall spacers and the second sidewall spacers to achieve a target distance between the first source/drain feature and the second source/drain feature.*

10. The method of claim [8] *1*, wherein the first [and second source/drain features are merged together such that the first and second/source drain features physically contact one another] *source/drain feature and the second source/drain feature are merged together, such that the first source/drain feature physically contacts the second/source drain feature, wherein the first height is adjusted during the process that forms the first sidewall spacers and the second sidewall spacers to achieve a target merging between the first source/drain feature and the second source/drain feature.*

11. A device comprising:

a first fin [formed on] *and a second fin separated by a distance S disposed over* a semiconductor substrate, wherein the first fin *is directly adjacent to the second fin, each of the first fin and the second fin* has a first width, *and each of the first fin and the second fin has a total fin height between a top surface of the semiconductor substrate and a bottom surface of a gate structure*;

[a first sidewall spacer having a first height and disposed along a sidewall of the first fin, wherein the first sidewall spacer and the first fin define a trench; and]

a first source/drain feature disposed over *a recessed portion of* the first fin [within the trench] *and a second source/drain feature disposed over a recessed portion of the second fin, wherein each of the recessed portion of the first fin and the recessed portion of the second fin has a recessed fin height between the top surface of the semiconductor substrate and a bottom surface of first source/drain feature and a bottom surface of the second source/drain feature, respectively, and the recessed fin height is less than the total fin height, and further wherein each of* the first source/drain feature [having] *and the second source/drain feature has* a first portion that has the first width and a second portion *disposed over the first portion* that has a second width that is greater than the first width[, wherein the first source/drain feature has a second height that that is greater than the first height]*;*

*a dielectric isolation feature disposed over the top surface of the semiconductor substrate, wherein the dielectric isolation feature has a thickness between the top surface of the semiconductor substrate and a top surface of the dielectric isolation feature and the thickness is less than the total fin height and greater than the recessed fin height, such that the dielectric isolation feature entirely covers sidewalls of the recessed portion of the first fin and sidewalls of the recessed portion of the second fin and partially covers sidewalls of the first portion of the first source/drain feature and sidewalls of the first portion of the second source/drain feature;*

*first sidewall spacers disposed over the dielectric isolation feature and partially covering the sidewalls of the first portion of the first source/drain feature, wherein the first sidewall spacers do not physically contact the second portion of the first source/drain feature;*

*second sidewall spacers disposed over the dielectric isolation feature and partially covering the sidewalls of the first portion of the second source/drain feature, wherein the second sidewall spacers do not physically contact the second portion of the second source/drain feature;*

*wherein each of the first sidewall spacers and the second sidewall spacers has a fin spacer height between a top surface of the dielectric isolation feature and top surfaces respectively of the first sidewall spacers and the second sidewall spacers;*

*wherein the fin spacer height is equal to a total fin spacer height of fin sidewall spacers along the first source/drain feature and the second source/drain feature;*

*wherein a sum of the thickness of the dielectric isolation feature and the total fin spacer height is less than the total fin height;*

*wherein the second portion of each of the first source/drain feature and the second source/drain feature do not physically contact the dielectric isolation feature;*

*wherein the second portion of each of the first source/drain feature and the second source/drain feature has a source/drain height between bottom surfaces respectively of the second portions of the first source/drain feature and the second source/drain feature and top surfaces respectively of the second portions of the first source/drain feature and the second source/drain feature; and*

*wherein the source/drain height is inversely proportional to the total fin spacer height, such that the source/drain height increases as the total fin spacer height decreases and the source/drain height decreases as the total fin spacer height increases.*

12. The device of claim 11, wherein the second portion of the first [fin includes] *source/drain feature and the second portion of the second source/drain feature each include* a first facet that is parallel to a second facet and a third facet that is parallel to [the] *a* fourth facet.

13. The device of claim 11, [further comprising a gate structure disposed over the first fin,] wherein the gate structure includes a metal gate electrode disposed over a high-k dielectric layer.

14. The device of claim 11, wherein the [first portion of the first fin includes a sidewall surface having a first segment that is covered by the first sidewall spacer and a second segment that is free of the first sidewall spacer] *second portion of the first source/drain feature and the second portion of the second source/drain feature each has a width defined as a greatest distance between two vertexes respectively of the second portion of the first source/drain feature and the second portion of the second source/drain feature and the width is inversely proportional to the fin spacer height*.

15. The device of claim 11, [further comprising:

a second fin formed on the semiconductor substrate;

a dielectric isolation structure disposed on the semiconductor substrate and extending from the first fin to the second fin;

a second source/drain feature disposed over the second fin, the second source/drain feature having a first portion that has the first width and a second portion that has the second width that is greater than the first width, wherein the second source/drain feature has the second height; and a second sidewall spacer disposed along a sidewall of the second fin, the second sidewall spacer having the first height] *wherein a merging distance is defined between a vertex of the second portion of the first source/drain feature and a vertex of the second portion of the second source/drain feature and the merging distance is proportional to the fin spacer height*.

16. A device comprising:

a dielectric isolation feature disposed on a semiconductor substrate;

a *first* fin *and a second fin separated by a distance S* formed on the semiconductor substrate and at least partially surrounded by the dielectric isolation feature, the *first* fin *and the second fin* having a first width measured between opposing sidewalls of the dielectric isolation feature *and the first fin and the second fin having a total fin height between a top surface of the semiconductor substrate and a bottom surface of a gate structure, wherein a portion of the first fin and a portion of the second fin have a top surface that is lower than a top surface of the dielectric isolation feature and the portion of the first fin and the portion of the second fin have a recessed fin height that is less than the total fin height*;

a *first* source/drain feature disposed directly on the *top surface of the portion of the* first fin *and a second source/drain feature disposed directly on the top surface of the portion of the second fin, wherein* the *first* source/drain feature [having] *and the second source/drain feature each has* a first portion at least partially surrounded by the dielectric isolation feature and having the first width measured between opposing sidewalls of the dielectric isolation feature, *and further wherein* the *first* source/drain feature [having] *and the second source/drain feature each has* a second portion [interfacing with] *above* the first portion and having a second width that is greater than the first width, wherein *a merging distance is defined between* the *second portion of the first* source/drain feature [has a first height] *and the second portion of the second source/drain feature*; and a [spacer] *first fin spacers* disposed *directly on the top surface of the dielectric isolation feature and at least partially* along [a sidewall] *sidewalls* of the *first portion of the first source/drain feature and second* fin *spacers disposed directly on the top surface of the dielectric isolation feature and at least partially along sidewalls of the first portion of the second source/drain feature, wherein:* the [spacer] *first fin spacers and the second fin spacers each* having a [second] *fin spacer* height that is *between the top surface of the dielectric isolation feature and top surfaces respectively of the first fin spacers and the second fin spacers,*

*the fin spacer height is equal to a total fin spacer height of fin sidewall spacers along the first source/drain feature and the second source/drain feature,*

*the first fin spacers do not physically contact the second portion of the first source/drain feature and the second fin spacers do not physically contact the second portion of the second source/drain feature,*

*a sum of a thickness of the dielectric isolation feature and the total fin spacer height is less than the total fin height,*

*the second portion of each of the first source/drain feature and the second source/drain feature do not physically contact the dielectric isolation feature, and*

[less than] *the merging distance is proportional to* the [first] *fin spacer* height, *such that the merging distance decreases as the fin spacer height decreases and the merging distance increases as the fin spacer height increases*.

17. The device of claim 16, wherein the [dielectric isolation feature has a third height that is greater than a fourth height of the fin] *merging distance equals zero*.

18. The device of claim 16, [further comprising a] *the* gate structure having a metal layer and a high-k dielectric layer.

19. The device of claim 16, wherein *each of* the first portion of the *first* source/drain feature *and the first portion of the second source/drain feature* has a sidewall that includes a first segment that is covered by the dielectric isolation feature, a second segment that is covered *respectively* by the [spacer] *first fin spacers and the second fin spacers*, and a third segment that is not covered by the dielectric isolation feature and the [spacer] *first fin spacers and the second fin spacers, respectively*.

20. The device of claim 16, wherein the [source/drain feature is merged with another source/drain feature] *merging distance is a negative number*.

*21. The method of claim 1, wherein the epitaxially growing the material includes epitaxially growing silicon.*

*22. The method of claim 1, wherein the recessing the second portion of the first fin and the second portion of the second fin includes etching the second portion of the first fin and the second portion of the second fin until a top surface of the second portion of the first fin and a top surface of the second portion of the second fin is lower than a top surface of the dielectric isolation feature.*

*23. The method of claim 1, wherein the epitaxially growing the material includes epitaxially growing silicon germanium.*

*24. The method of claim 1, wherein the bottom portion of each of the first source/drain feature and the second source/drain feature has a third height, wherein the third height is greater than the first height.*

*25. The device of claim 11, wherein the dielectric isolation feature is disposed between the first fin and the second fin.*

*26. The device of claim 11, wherein the first fin and the second fin include a first semiconductor material, the first source/drain feature and the second source/drain feature include a second semiconductor material, the dielectric isolation feature includes a first dielectric material, and the first sidewall spacers and the second sidewall spacers include a second dielectric material.*

*27. The device of claim 11, wherein:*

*the first portion of the first source/drain feature has a first interface with the second portion of the first source/drain feature and the first portion of the second source/drain feature has a second interface with the second portion of the second source/drain feature; and*

*a distance between the top surface of the dielectric isolation feature and the first interface and the second interface, respectively, is greater than the total fin spacer height.*

*28. The device of claim 11, wherein the second portion of the first source/drain feature and the second portion of the second source/drain feature each have rhombus-shaped cross-sectional profiles.*

*29. The device of claim 16, wherein the merging distance is a positive number.*

*30. The device of claim 16, wherein:*

*the first portion of the first source/drain feature is connected to the second portion of the first source/drain feature at a first interface;*

*the second portion of the first source/drain feature is connected to the second portion of the second source/drain feature at a second interface;*

*the second portion of the first source/drain feature has a first height between the first interface and a topmost point of the second portion of the first source/drain feature, wherein the first height is inversely proportional to the fin spacer height; and*

*the second portion of the second source/drain feature has a second height between the second interface and a topmost point of the second portion of the second source/drain feature, wherein the second height is inversely proportional to the fin spacer height.*

*31. The device of claim 16, wherein:*

*the second portion of the first source/drain feature is diamond-shaped and has a first width defined between vertexes of the first source/drain feature, wherein the first width is inversely proportional to the fin spacer height; and*

*the second portion of the second source/drain feature is diamond-shaped and has a second width defined between vertexes of the first source/drain feature, wherein the second width is inversely proportional to the fin spacer height.*

* * * * *